United States Patent
Nguyen et al.

(10) Patent No.: US 9,473,185 B2
(45) Date of Patent: Oct. 18, 2016

(54) IMPEDANCE MATCHING FOR VARIABLE IMPEDANCE ANTENNAS

(71) Applicant: Marvell World Trade Ltd., St. Michael (BB)

(72) Inventors: Huy Thong Nguyen, Singapore (SG); Poh Boon Leong, Cupertino, CA (US); Xiaowei Zhong, Singapore (SG); Sun Shuo, Sinapore (SG)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/678,577

(22) Filed: Apr. 3, 2015

(65) Prior Publication Data
US 2015/0288400 A1 Oct. 8, 2015

Related U.S. Application Data

(60) Provisional application No. 61/975,602, filed on Apr. 4, 2014.

(51) Int. Cl.
| | |
|---|---|
| *H04B 17/02* | (2006.01) |
| *H04B 1/12* | (2006.01) |
| *H04W 72/04* | (2009.01) |
| *H04W 88/06* | (2009.01) |
| *H03H 7/01* | (2006.01) |

(Continued)

(52) U.S. Cl.
CPC .......... *H04B 1/126* (2013.01); *H03H 7/0115* (2013.01); *H03H 7/0153* (2013.01); *H03H 7/175* (2013.01); *H03H 7/1708* (2013.01); *H03H 7/1766* (2013.01); *H03H 7/1775* (2013.01); *H03H 7/1783* (2013.01); *H03H 7/1791* (2013.01); *H03H 7/38* (2013.01); *H03H 7/46* (2013.01); *H04W 72/0453* (2013.01); *H04W 88/06* (2013.01); *H03H 7/465* (2013.01); *H03H 2007/386* (2013.01)

(58) Field of Classification Search
CPC ...................................................... H04B 1/126
USPC ....................................................... 455/136
See application file for complete search history.

(56) References Cited

U.S. PATENT DOCUMENTS

| | | | |
|---|---|---|---|
| 1,985,042 A | 12/1934 | Lane | |
| 6,084,486 A | 7/2000 | Suzuki et al. | |

(Continued)

FOREIGN PATENT DOCUMENTS

| | | |
|---|---|---|
| DE | 1221376 B | 7/1966 |
| WO | WO-0249142 A1 | 6/2002 |

OTHER PUBLICATIONS

Invitation to Pay Addition Fees and, Where Applicable, Protest Fee and Partial International Search Report for PCT/US2015/024350 dated Jul. 20, 2015.

*Primary Examiner* — Sanh Phu

(57) ABSTRACT

An impedance matching circuit for a wireless communication device includes: a first node that receives a first impedance; a second node that is connected to an antenna having a second impedance; a first variable capacitor that is connected between the first node and a third node; a second variable capacitor that is connected between the third node and a reference potential; a first inductive element that is connected in parallel with the second variable capacitor between the third node and the reference potential; and a third variable capacitor and a second inductive element that are connected in series between the third node and the second node.

42 Claims, 8 Drawing Sheets

(51) Int. Cl.
*H03H 7/38* (2006.01)
*H03H 7/46* (2006.01)

(56) References Cited

U.S. PATENT DOCUMENTS

| | | | |
|---|---|---|---|
| 8,923,777 B2* | 12/2014 | Nezhad-Ahmadi | H04L 27/10 370/278 |
| 2007/0285187 A1 | 12/2007 | Kawasaki | |
| 2008/0136729 A1* | 6/2008 | Kang | H04B 1/18 343/861 |
| 2012/0286889 A1 | 11/2012 | Park et al. | |

* cited by examiner

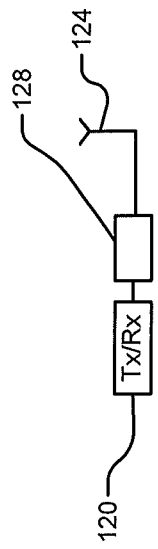
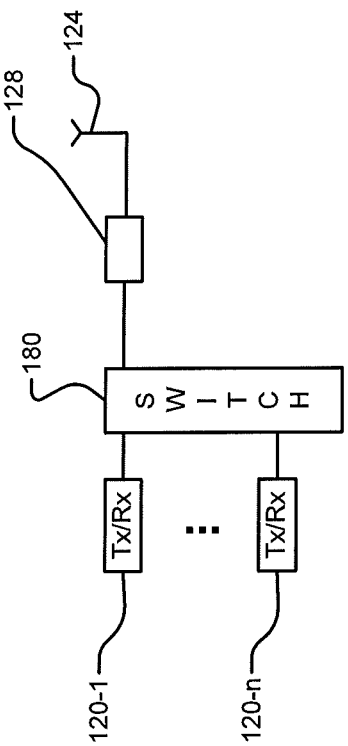
FIG. 1b
FIG. 1c
FIG. 1d

IMPEDANCE MATCHING FOR VARIABLE IMPEDANCE ANTENNAS

CROSS-REFERENCE TO RELATED APPLICATIONS

This application claims the benefit of U.S. Provisional Application No. 61/975,602, filed on Apr. 4, 2014. The entire disclosure of the application referenced above is incorporated herein by reference.

FIELD

The present disclosure relates to impedance matching and more particularly to impedance matching circuits for variable impedance antennas.

BACKGROUND

Wireless devices, such as cellular phones and tablet devices include one or more antennas. Wireless devices transmit and receive data wirelessly using the antennas. The impedance of an antenna may change, however, under some circumstances. For example, the impedance of an antenna may change based on user proximity to a cellular phone or tablet device. Additionally or alternatively, the impedance of an antenna may change when a user touches a cellular phone or tablet device. Impedance matching for an antenna may also be referred to as antenna tuning.

SUMMARY

In a feature, an impedance matching circuit for a wireless communication device is described. A first node receives a first impedance. A second node is connected to an antenna having a second impedance. A first variable capacitor is connected between the first node and a third node. A second variable capacitor is connected between the third node and a reference potential. A first inductive element is connected in parallel with the second variable capacitor between the third node and the reference potential. A third variable capacitor and a second inductive element are connected in series between the third node and the second node.

In other features, the impedance matching circuit further includes a first energy storage device connected between the first node and the reference potential.

In other features, the impedance matching circuit further includes a second energy storage device connected between the second node and the reference potential.

In other features, the second energy storage device includes: an inductor including a first end connected to the second node and a second end connected to the reference potential; and a capacitor including a first end connected to the reference potential and at a second end connected to the inductor between the first and second ends of the inductor.

In other features, the impedance matching circuit further includes a fourth capacitor connected in series with the third variable capacitor and the second inductive element between the third node and the second node.

In other features, the impedance matching circuit further includes a first energy storage device connected in parallel with the first variable capacitor between the first node and the third node.

In other features, the impedance matching circuit further includes a second energy storage device connected between the second node and the reference potential.

In other features, the impedance matching circuit further includes a fourth capacitor connected in series with the third variable capacitor and the second inductive element between the third node and the second node.

In other features, the impedance matching circuit further includes a fourth variable capacitor including a first end connected to the third node and a second end connected to a first point of an inductor of the second inductive element, where the first point is between first and second ends of the inductor.

In other features, the impedance matching circuit further includes a fifth variable capacitor including a first end connected to the third node and a second end connected to a second point of the inductor of the second inductive element, where the second point is between the first and second ends of the inductor, and where the second point is different than the first point.

In other features, the impedance matching circuit further includes a fourth variable capacitor including a first end connected to the second node and a second end connected to a first point of an inductor of the second inductive element, where the first point is between first and second ends of the inductor.

In other features, the impedance matching circuit further includes a fifth variable capacitor including a first end connected to the second node and a second end connected to a second point of the inductor of the second inductive element, where the second point is between the first and second ends of the inductor, and where the second point is different than the first point.

In other features, the impedance matching circuit further includes an energy storage device including: an inductor including a first end connected to the second node and a second end connected to the reference potential; and a capacitor including a first end connected to the reference potential and a second end connected to a point of the inductor between the first and second ends of the inductor.

In other features, the first, second, and third variable capacitors include switch capacitors.

In a feature, a wireless communication device includes: a transceiver that is connected to a first node, that includes a first impedance, and that is configured to operate based on at least one of: a first frequency band of a Global System for Mobile (GSM) communications standard; a second frequency band of a Long-Term Evolution (LTE) communications standard; and a third frequency band of a Wideband Code Division Multiple Access (WCDMA) standard. The wireless communication device further includes: an antenna that is connected to a second node and that includes a first impedance; a first switch capacitor connected between the first node and a third node; a second switch capacitor connected between the third node and a reference potential; a first inductive element connected in parallel with the second switch capacitor between the third node and the reference potential; and a third switch capacitor, a second inductive element, and a fourth capacitor connected in series between the third node and the second node.

In a feature, a method for wireless communication includes, using a transceiver that is connected to a first node and that includes a first impedance, operating based on at least one of: a first frequency band of a Global System for Mobile (GSM) communications standard; a second frequency band of a Long-Term Evolution (LTE) communications standard; and a third frequency band of a Wideband Code Division Multiple Access (WCDMA) standard. The method further includes: connecting an antenna that includes a second impedance to a second node; connecting a first switch capacitor between the first node and a third node; connecting a second switch capacitor between the third node and a reference potential; connecting a first inductive element in parallel with the second switch capacitor between the third node and the reference potential; and connecting a third switch capacitor, a second inductive element, and a fourth capacitor in series between the third node and the second node.

In other features, the method further includes, in response to a change in the second impedance of the antenna, at least one of: a first capacitance of the first variable capacitor changes; a second capacitance of the second variable capacitor changes; and a third capacitance of the third variable capacitor changes.

In other features, the method further includes, in response to a change in the second impedance of the antenna, changing at least one of: a first capacitance of the first variable capacitor; a second capacitance of the second variable capacitor; and a third capacitance of the third variable capacitor.

In other features, the method further includes: connecting a first energy storage device between the first node and the reference potential; and connecting a second energy storage device between the second node and the reference potential.

In other features, the method further includes: connecting a first energy storage device in parallel with the first variable capacitor between the first node and the third node; and connecting a second energy storage device connected between the second node and the reference potential.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIGS. 1b-1d are functional block diagrams of example circuits including one or more impedance matching circuits.

In the drawings, reference numbers may be reused to identify similar and/or identical elements.

DESCRIPTION

Figure 1A:
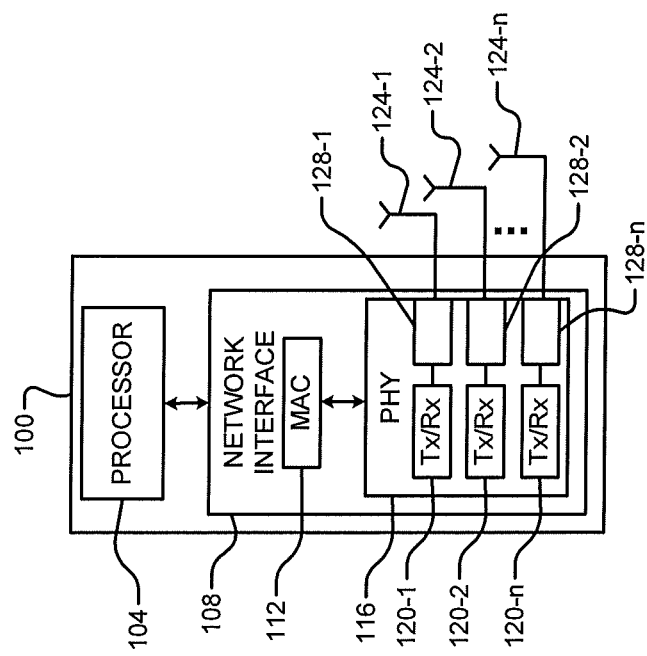
FIG. 1a is a functional block diagram of an example wireless communication device including multiple antennas and impedance matching circuits.

Referring now to FIG. 1a, a wireless device 100 includes a host device 104 in communication with a wireless network interface 108. The wireless network interface 108 includes a medium access control (MAC) device 112 and a physical layer (PHY) device 116. The PHY device 116 provides a physical interface between the MAC device 112 and a wireless medium. The MAC device 112 provides an interface between the PHY device 116 and the host device 104. The host device 104 and the network interface 112 may have dedicated or shared processors and memory. The PHY device 116 includes a plurality of transceivers 120-1, 120-2, . . . , and 120-n (collectively transceivers 120). The transceivers 120 communicate with respective antennas 124-1, 124-2, . . . , and 124-n (collectively antennas 124).

The impedances of the antennas 124 change under some circumstances. For example, the impedance of an antenna may change when a user touches the wireless device 100. The impedance of an antenna may additionally or alternatively change based on proximity of the user to the wireless device 100, such as a distance between a user's head and a wireless device 100. The wireless device 100 may operate based on frequency bands of, for example, the Global System for Mobile (GSM) communications standard, the Wideband Code Division Multiple Access (WCDMA) standard, and/or the Long-Term Evolution (LTE) standard.

The transceivers 120 may have a predetermined impedance. For example only, the predetermined impedance may be approximately 50 Ohms ($\Omega$) or another suitable impedance. The PHY device 116 includes one or more impedance matching circuits 128-1, 128-2, . . . , 128-n (collectively impedance matching circuits 128) that provide impedance matching between the transceivers 120 which have the predetermined impedance and the antennas 124 that have variable impedances. For example only, one impedance matching circuit may be provided for each transceiver and antenna pair. In various implementations, the impedance matching circuits 128 may be implemented within the transceivers 120.

FIG. 1b shows an example system including a single transceiver 120, a single antenna 124, and a single impedance matching circuit 128. FIG. 1c shows an example system including multiple transceivers 120-1-120-n, multiple impedance matching circuits 128-1-128-n, and multiple antennas 124-1-124-n. FIG. 1d shows an example system including multiple transceivers 120-1-120-n, a single impedance matching circuit 128, and a single antenna 124. In FIG. 1d, one or more switching devices, such as switching device 180, control which transceiver is connected to the impedance matching circuit 128 and the antenna 124.

Figure 2:
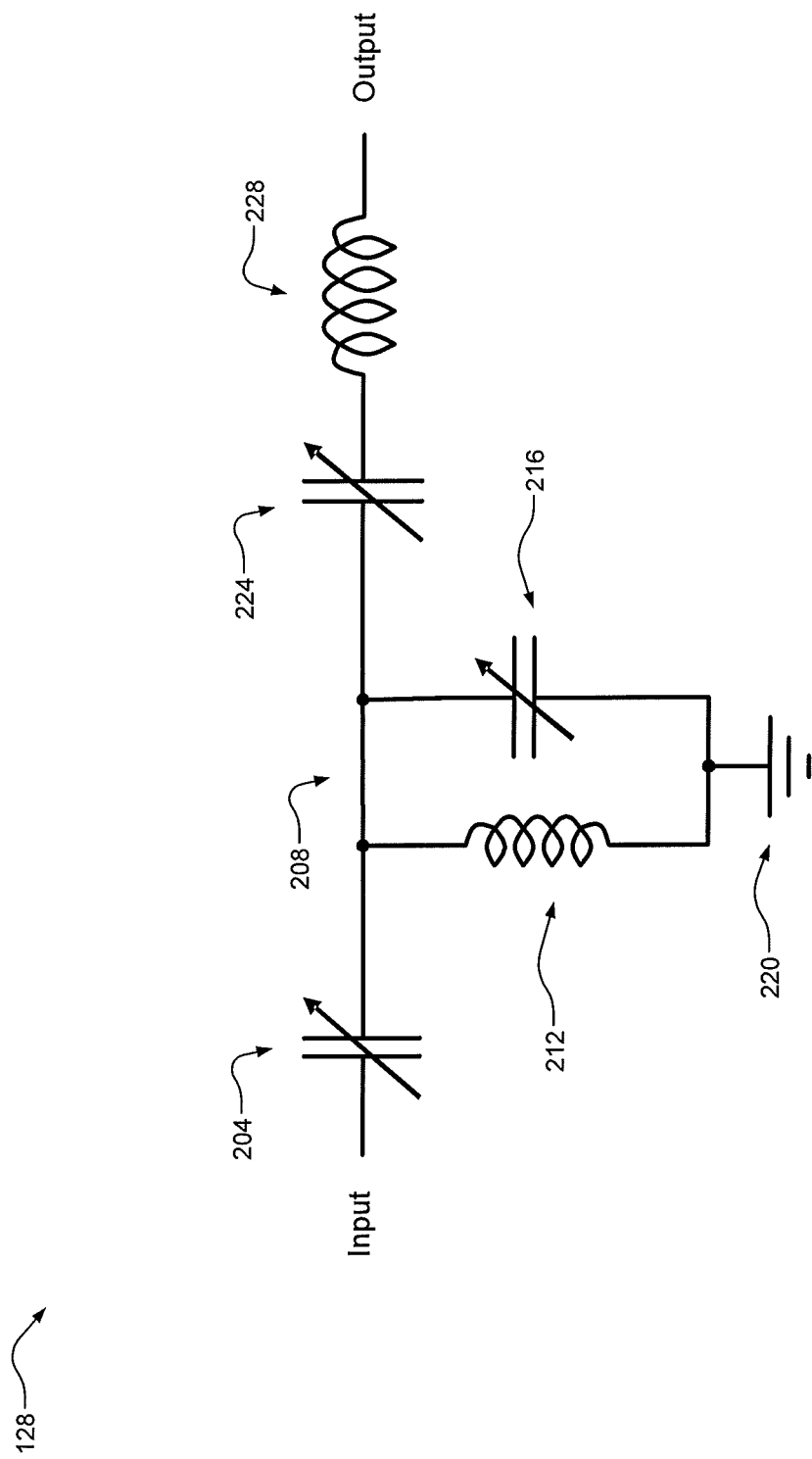
FIG. 2 is a schematic of an example of an impedance matching circuit.

Referring now to FIG. 2, an example impedance matching circuit 128 is shown. The impedance matching circuit 128 includes a first variable capacitor 204 that is connected between a first node (e.g., connected to a transceiver 120) and a common node 208. The impedance at the first node is the predetermined impedance of the transceiver 120, such as approximately 50 Ohms ($\Omega$). The first variable capacitor 204 may include a switched capacitor or another suitable type of variable capacitor. In various implementations, the first variable capacitor 204 and an inductive element may be implemented between the first node and the common node 208.

The impedance matching circuit 128 also includes a first inductive element 212 and a second variable capacitor 216. The first inductive element 212 is connected in parallel with the second variable capacitor 216 between the common node 208 and a ground reference potential 220. The second variable capacitor 216 may include a switched capacitor or another suitable type of variable capacitor. As used herein, the term inductive element may include a single inductor, multiple inductors, or one or more inductors connected with one or more other components that collectively provide an inductance.

Figure 7:
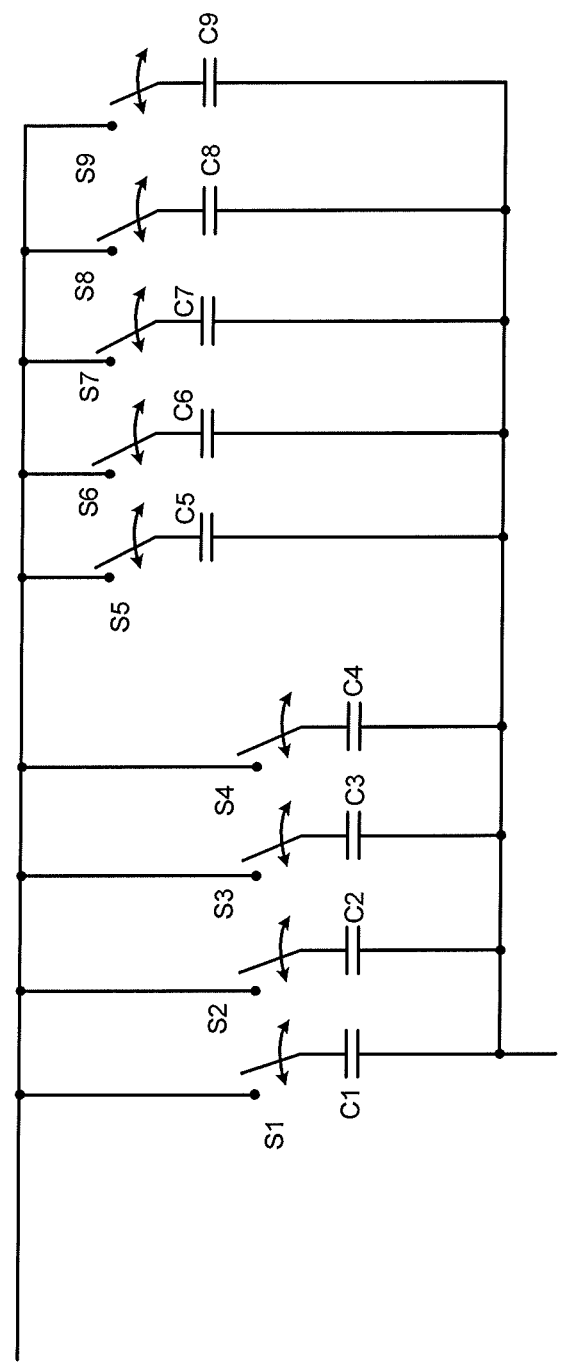
FIG. 7 is a schematic of an example variable capacitor circuit.

The impedance matching circuit 128 also includes a third variable capacitor 224 and a second inductive element 228 that are connected in series between the common node and a second node. As discussed further below, the second node is connected to an antenna, and the impedance at the second node varies. The third variable capacitor 224 may include a switched capacitor or another suitable type of variable capacitor. FIG. 7 includes a schematic of an example variable capacitor including a capacitor array and switching devices. Other variable capacitors may include capacitors and/or switches connected in different configurations.

One or more control modules may be implemented to control switching and, therefore the capacitances, of the first, second, and third variable capacitors 204, 216, and 224. For example, a control module may control switching of the switching devices of FIG. 7 to control the combination of one or more capacitors that are connected.

Figure 3:
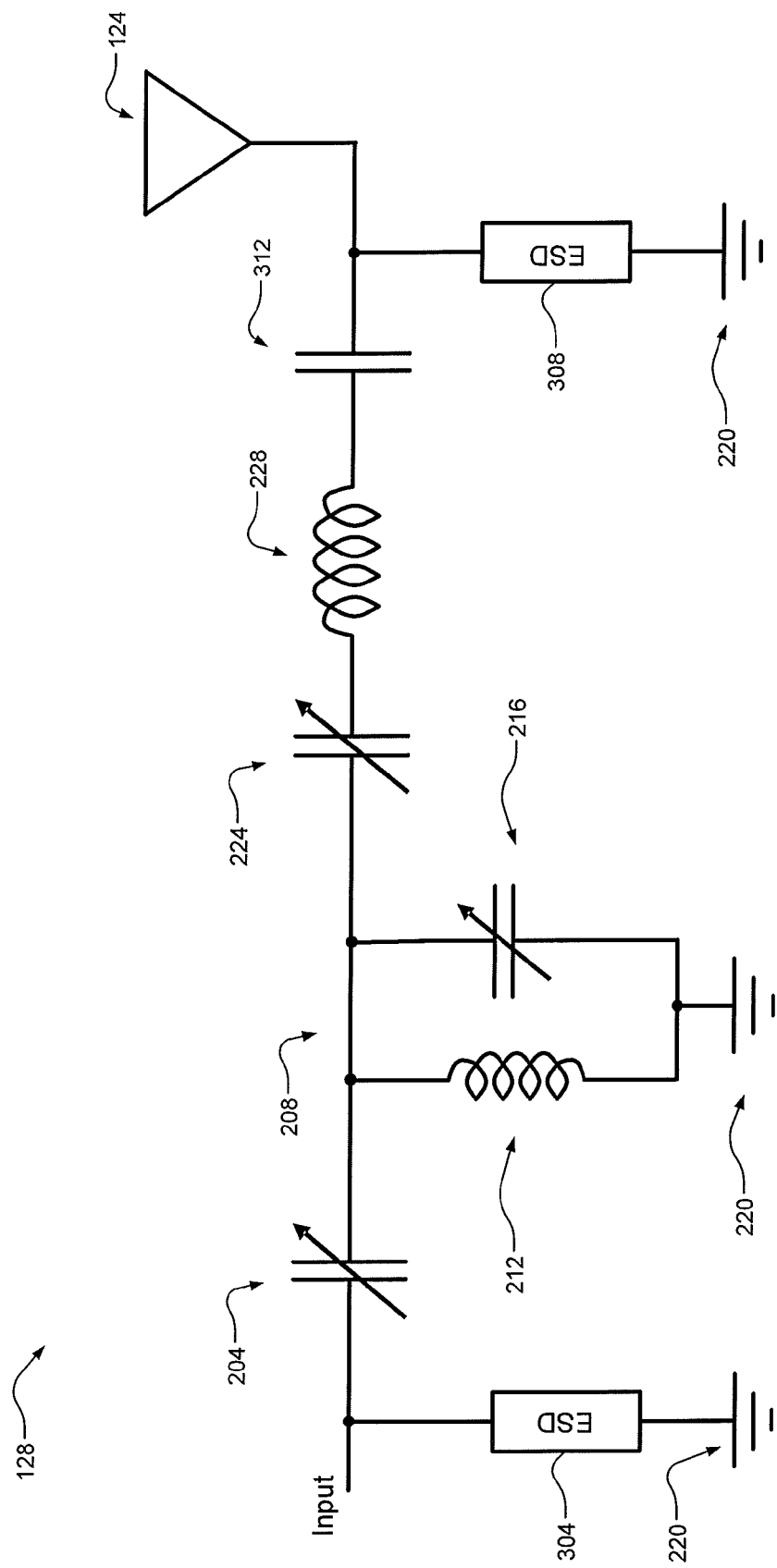
FIGS. 3-4 are schematics of examples of impedance matching circuits with energy storage devices.
Figure 4:
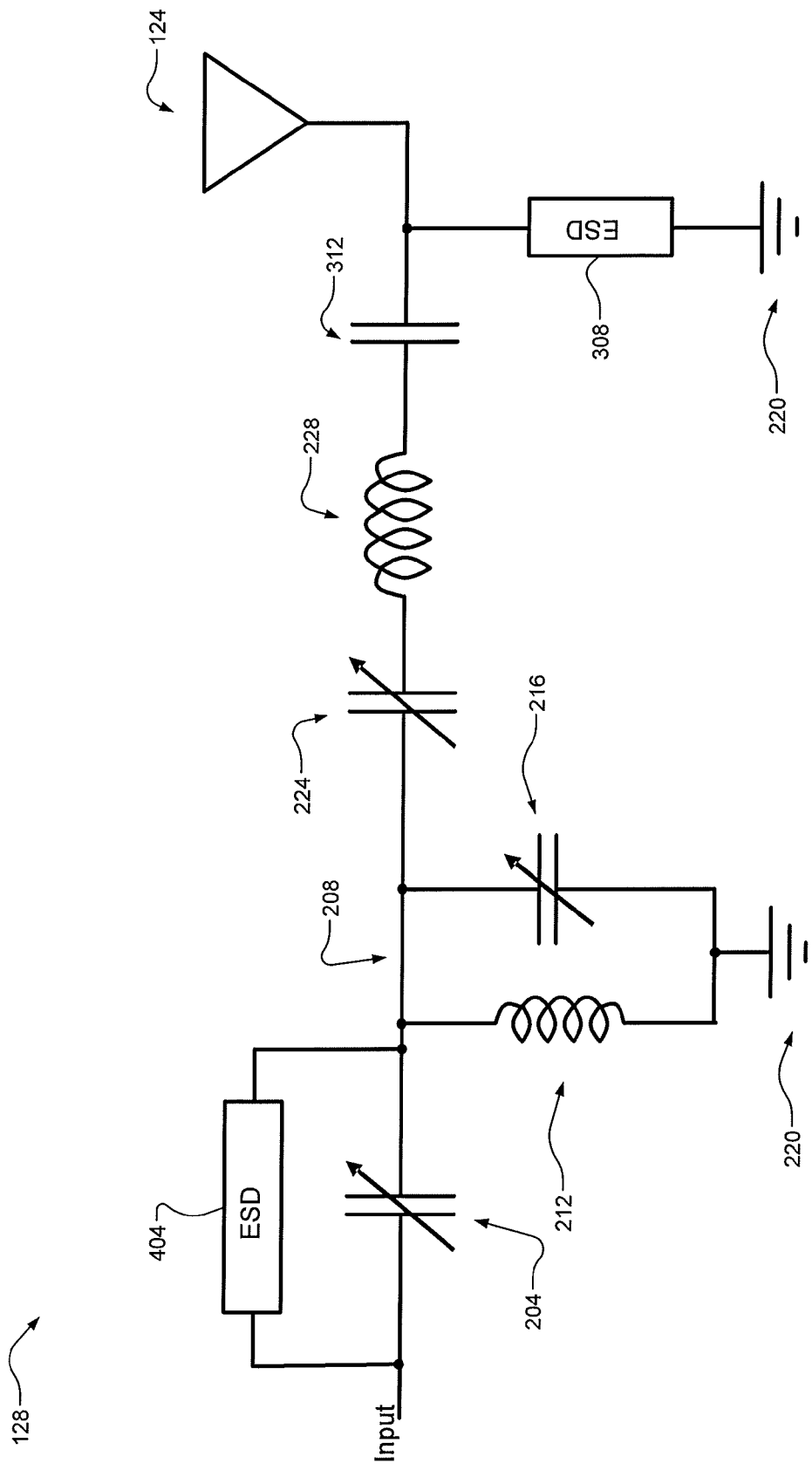

Referring now to FIGS. 3 and 4, another example impedance matching circuit 128 is shown. The impedance matching circuit 128 may include one or more energy storage devices (ESDs) connected to the first node and/or the second node. The ESD(s) may provide circuit protection.

For example, as shown in FIG. 3, the impedance matching circuit 128 may include a first ESD 304 connected between the first node and the ground reference potential 220. The impedance matching circuit 128 may additionally or alternatively include a second ESD 308 connected between the second node and the ground reference potential 220.

The first and second ESDs 304 and 308 may include one or more inductors, one or more capacitors, and/or a combination of two or more energy storing devices (e.g., inductors and/or capacitors). A capacitor 312 may also be connected in series with the third variable capacitor 224 and the second inductive element 228 between the common node 208 and the antenna 124. In various implementations, the capacitor 312 may be a fixed (non-variable) capacitor. The antenna 124 may be a transmit antenna or a receive antenna.

As shown in FIG. 4, the impedance matching circuit 128 may include the second ESD 308 and/or a third ESD 404. The third ESD 404 is connected in parallel with the first variable capacitor 204 between the first node and the common node 208. The third ESD 404 may include one or more inductors, one or more capacitors, and/or a combination of two or more energy storing devices (e.g., inductors and/or capacitors).

The impedance matching circuit 128 provides impedance matching when the impedance of the antenna 124 changes. More specifically, the impedance of the impedance matching circuit 128 adjusts in an effort to match the predetermined impedance with the combination of: the variable impedance of the antenna 124 and the impedance matching circuit 128.

One or more control modules may adjust capacitances of the first, second, and/or third variable capacitors 204, 216, and/or 224 for impedance matching in response to a change in the impedance of the antenna 124. For example, the control module(s) may adjust switching frequency to adjust capacitance in the case of switch capacitors. Alternatively, the variable capacitors may be active or passive variable capacitors that adjust capacitance in response to a change in the impedance of the antenna 124.

Figure 5:
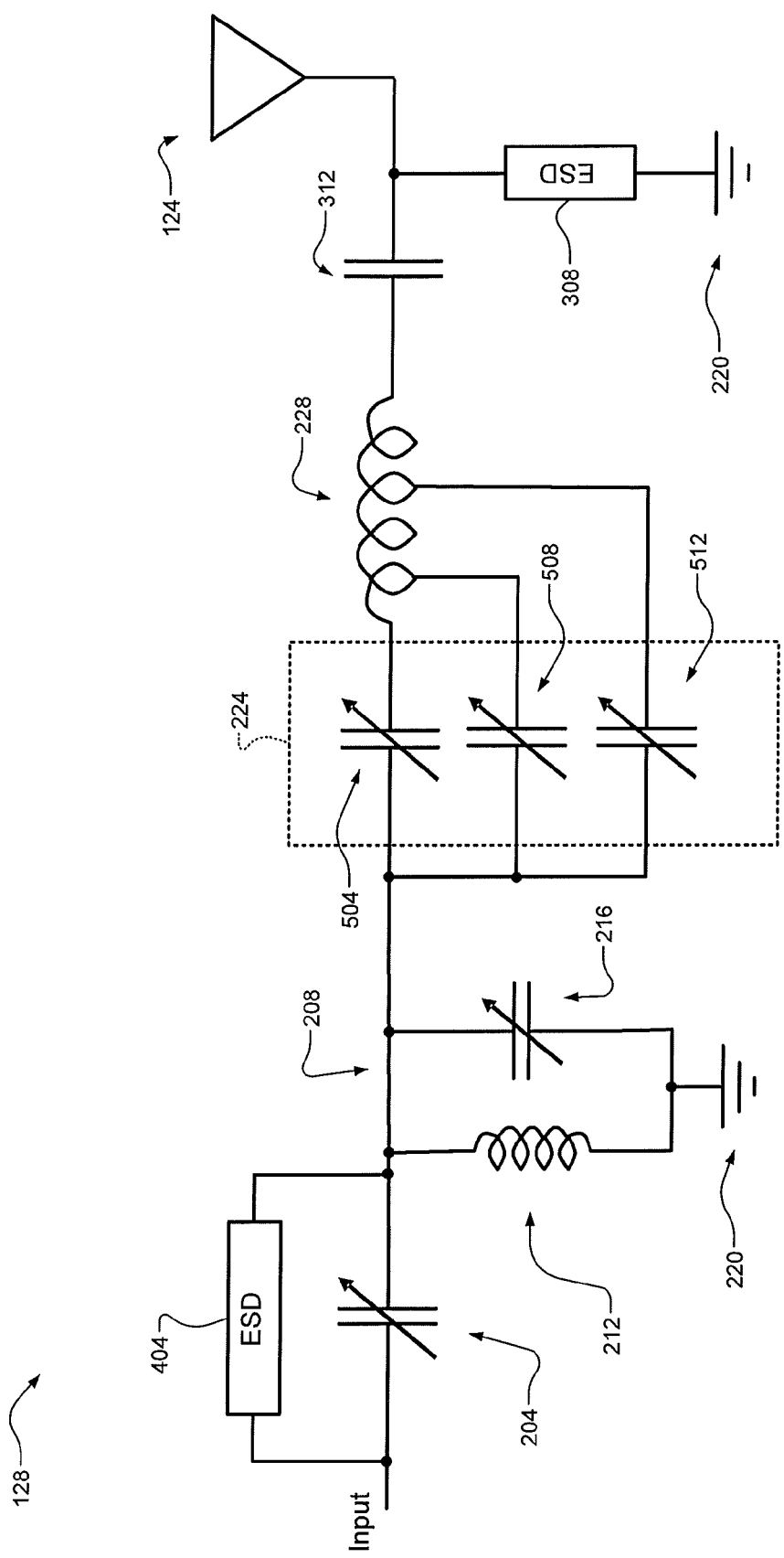
FIGS. 5-6 are schematics of examples of impedance matching circuits implementing inductor tapping point schemes.
Figure 6:
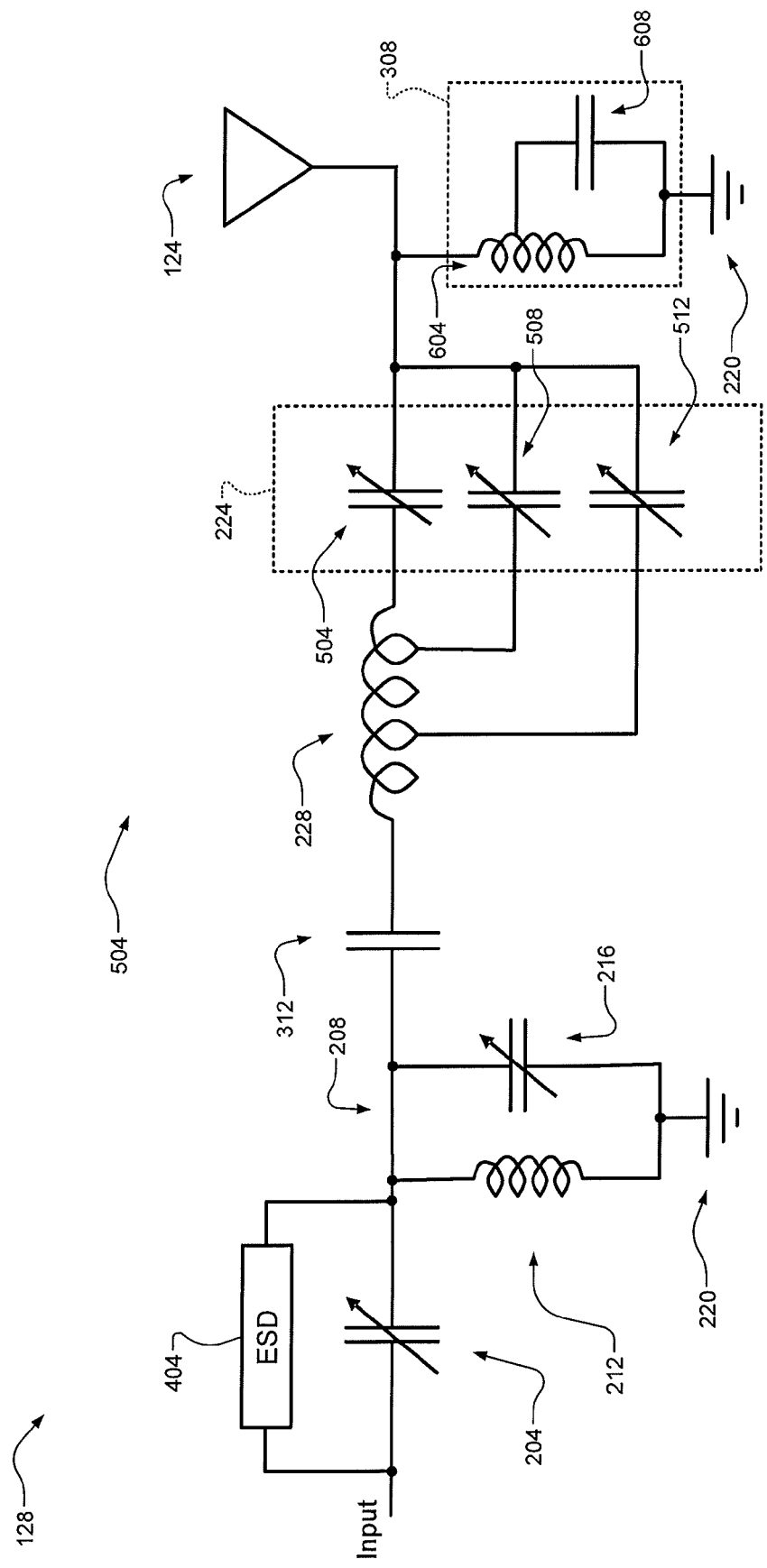

FIGS. 5 and 6 include additional schematics of the example impedance matching circuit 128 implementing inductor tapping point schemes. The third variable capacitor 224 may include two or more variable capacitors that are connected to different points of an inductor of the second inductive element 228.

For example, in FIG. 5, the third variable capacitor 224 includes a fourth variable capacitor 504, a fifth variable capacitor 508, and a sixth variable capacitor 512. The fourth variable capacitor 504 is connected between the common node 208 and one end of the inductor. The fifth variable capacitor 508 is connected between the common node 208 and a first point of the inductor that is between the two ends of the inductor. The sixth variable capacitor 512 is connected between the common node 208 and a second point between the two ends of the inductor. With this configuration, one end of each of the fourth, fifth, and sixth variable capacitors 504, 508, and 512 is connected to the common node 208 while the other ends of the fourth, fifth, and sixth variable capacitors 504, 508, and 512 are "tapped" to different points of the inductor. The fourth, fifth, and sixth variable capacitors 504, 508, and 512 may include switched capacitors or another suitable type of variable capacitor.

FIG. 6 illustrates another example connection of the capacitor 312, the second inductive element 228, and the third variable capacitor 224. In the example of FIG. 6, one end of each of the fourth, fifth, and sixth variable capacitors 504, 508, and 512 is connected to the second node while the other ends the fourth, fifth, and sixth variable capacitors 504, 508, and 512 are tapped to different points of the inductor.

FIG. 6 also illustrates that one or more of the ESDs can be a part of the impedance matching circuit and aid in the impedance matching. For example, the second ESD 308 may include an inductor 604 and a capacitor 608. One end of the inductor 604 may be connected to the second node, and the other end of the inductor 604 may be connected to the ground reference potential 220. An inductor tapping point scheme may be used, for example, including one end of the capacitor 608 being connected to the ground reference potential 220 and the other end of the capacitor 608 being connected to a point between the ends of the inductor 604.

By way of example only, the first and second inductive elements 212 and 228 may have inductances less than 50 nanoHenry (nH) (e.g., between 0 nH and 50 nH), and have quality factors that are greater than or equal to 15. The variable capacitors 204, 216, and 224 may have capacitances between 0.1 picoFarad (pF) and 20 pF and have a tuning range of at least 2:1. The impedance matching circuit 128 provides impedance matching between the predetermined impedance and the variable impedance of the antenna 124 throughout the operating impedance range of the antenna 124. Additionally, a footprint area of the impedance matching circuit 128 may be small. The area occupied by the impedance matching circuit 128 on a chip is therefore minimized.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. An impedance matching circuit for a wireless communication device, comprising:
   a first node receiving a first impedance;
   a second node connected to an antenna having a second impedance;
   a first variable capacitor connected between the first node and a third node;
   a second variable capacitor connected between the third node and a reference potential;
   a first inductive element connected in parallel with the second variable capacitor between the third node and the reference potential; and
   a third variable capacitor and a second inductive element connected in series between the third node and the second node,
   wherein, in response to a change in the second impedance of the antenna, at least one of:
   (i) a first capacitance of the first variable capacitor changes;
   (ii) a second capacitance of the second variable capacitor changes; and
   (iii) a third capacitance of the third variable capacitor changes.

2. The impedance matching circuit of claim 1 further comprising a first energy storage device connected between the first node and the reference potential.

3. The impedance matching circuit of claim 2 further comprising a second energy storage device connected between the second node and the reference potential.

4. The impedance matching circuit of claim 3 wherein the second energy storage device comprises:
   an inductor including a first end connected to the second node and a second end connected to the reference potential; and
   a capacitor including a first end connected to the reference potential and at a second end connected to the inductor between the first and second ends of the inductor.

5. The impedance matching circuit of claim 3 further comprising a fourth capacitor connected in series with the third variable capacitor and the second inductive element between the third node and the second node.

6. The impedance matching circuit of claim 1 further comprising a first energy storage device connected in parallel with the first variable capacitor between the first node and the third node.

7. The impedance matching circuit of claim 6 further comprising a second energy storage device connected between the second node and the reference potential.

8. The impedance matching circuit of claim 7 further comprising a fourth capacitor connected in series with the third variable capacitor and the second inductive element between the third node and the second node.

9. The impedance matching circuit of claim 1 further comprising a fourth variable capacitor including a first end connected to the third node and a second end connected to a first point of an inductor of the second inductive element,
   wherein the first point is between first and second ends of the inductor.

10. The impedance matching circuit of claim 9 further comprising a fifth variable capacitor including a first end connected to the third node and a second end connected to a second point of the inductor of the second inductive element,
    wherein the second point is between the first and second ends of the inductor, and
    wherein the second point is different than the first point.

11. The impedance matching circuit of claim 1 further comprising a fourth variable capacitor including a first end connected to the second node and a second end connected to a first point of an inductor of the second inductive element,
    wherein the first point is between first and second ends of the inductor.

12. The impedance matching circuit of claim 11 further comprising a fifth variable capacitor including a first end connected to the second node and a second end connected to a second point of the inductor of the second inductive element,
    wherein the second point is between the first and second ends of the inductor, and
    wherein the second point is different than the first point.

13. The impedance matching circuit of claim 12 further comprising an energy storage device comprising:
    an inductor including a first end connected to the second node and a second end connected to the reference potential; and a capacitor including a first end connected to the reference potential and a second end connected to a point of the inductor between the first and second ends of the inductor.

14. The impedance matching circuit of claim 1 wherein the first, second, and third variable capacitors include switch capacitors.

15. A wireless communication device comprising:
a transceiver that is connected to a first node, that includes a first impedance, and that is configured to operate based on at least one of:
  a first frequency band of a Global System for Mobile (GSM) communications standard;
  a second frequency band of a Long-Term Evolution (LTE) communications standard; and
  a third frequency band of a Wideband Code Division Multiple Access (WCDMA) standard;
an antenna that is connected to a second node and that includes a second impedance;
a first switch capacitor connected between the first node and a third node;
a second switch capacitor connected between the third node and a reference potential;
a first inductive element connected in parallel with the second switch capacitor between the third node and the reference potential; and
a third switch capacitor, a second inductive element, and a fourth capacitor connected in series between the third node and the second node,
wherein, in response to a change in the second impedance of the antenna, at least one of:
  (i) a first capacitance of the first switch capacitor changes;
  (ii) a second capacitance of the second switch capacitor changes; and
  (iii) a third capacitance of the third switch capacitor changes.

16. A method for wireless communication comprising:
using a transceiver that is connected to a first node and that includes a first impedance, operating based on at least one of:
  a first frequency band of a Global System for Mobile (GSM) communications standard;
  a second frequency band of a Long-Term Evolution (LTE) communications standard; and
  a third frequency band of a Wideband Code Division Multiple Access (WCDMA) standard;
connecting an antenna that includes a second impedance to a second node;
connecting a first switch capacitor between the first node and a third node;
connecting a second switch capacitor between the third node and a reference potential;
connecting a first inductive element in parallel with the second switch capacitor between the third node and the reference potential; and
connecting a third switch capacitor, a second inductive element, and a fourth capacitor in series between the third node and the second node,
wherein, in response to a change in the second impedance of the antenna, at least one of:
  (i) a first capacitance of the first switch capacitor changes;
  (ii) a second capacitance of the second switch capacitor changes; and
  (iii) a third capacitance of the third switch capacitor changes.

17. The method of claim 16 further comprising:
connecting a first energy storage device between the first node and the reference potential; and
connecting a second energy storage device between the second node and the reference potential.

18. The method of claim 16 further comprising:
connecting a first energy storage device in parallel with the first switch capacitor between the first node and the third node; and
connecting a second energy storage device connected between the second node and the reference potential.

19. A method for wireless communication comprising:
using a transceiver that is connected to a first node and that includes a first impedance, operating based on at least one of:
  a first frequency band of a Global System for Mobile (GSM) communications standard;
  a second frequency band of a Long-Term Evolution (LTE) communications standard; and
  a third frequency band of a Wideband Code Division Multiple Access (WCDMA) standard;
connecting an antenna that includes a second impedance to a second node;
connecting a first switch capacitor between the first node and a third node;
connecting a second switch capacitor between the third node and a reference potential;
connecting a first inductive element in parallel with the second switch capacitor between the third node and the reference potential; and
connecting a third switch capacitor, a second inductive element, and a fourth capacitor in series between the third node and the second node,
wherein, in response to a change in the second impedance of the antenna, changing at least one of:
  (i) a first capacitance of the first switch capacitor;
  (ii) a second capacitance of the second switch capacitor; and
  (iii) a third capacitance of the third switch capacitor.

20. The method of claim 19 further comprising:
connecting a first energy storage device between the first node and the reference potential; and
connecting a second energy storage device between the second node and the reference potential.

21. The method of claim 19 further comprising:
connecting a first energy storage device in parallel with the first switch capacitor between the first node and the third node; and
connecting a second energy storage device connected between the second node and the reference potential.

22. A wireless communication device comprising:
a transceiver that is connected to a first node, that includes a first impedance, and that is configured to operate based on at least one of:
  a first frequency band of a Global System for Mobile (GSM) communications standard;
  a second frequency band of a Long-Term Evolution (LTE) communications standard; and
  a third frequency band of a Wideband Code Division Multiple Access (WCDMA) standard;
an antenna that is connected to a second node and that includes a second impedance;
a first switch capacitor connected between the first node and a third node;
a second switch capacitor connected between the third node and a reference potential;
a first inductive element connected in parallel with the second switch capacitor between the third node and the reference potential;
a third switch capacitor, a second inductive element, and a fourth capacitor connected in series between the third node and the second node; and at least one control module configured to, in response to a change in the second impedance of the antenna, change at least one of:
  (i) a first capacitance of the first switch capacitor;
  (ii) a second capacitance of the second switch capacitor; and
  (iii) a third capacitance of the third switch capacitor.

23. An impedance matching circuit for a wireless communication device, comprising:
  a first node receiving a first impedance;
  a second node connected to an antenna having a second impedance;
  a first variable capacitor connected between the first node and a third node;
  a second variable capacitor connected between the third node and a reference potential;
  a first inductive element connected in parallel with the second variable capacitor between the third node and the reference potential;
  a third variable capacitor and a second inductive element connected in series between the third node and the second node; and
  at least one control module configured to, in response to a change in the second impedance of the antenna, change at least one of:
    (i) a first capacitance of the first variable capacitor;
    (ii) a second capacitance of the second variable capacitor; and
    (iii) a third capacitance of the third variable capacitor.

24. The impedance matching circuit of claim 23 further comprising a first energy storage device connected between the first node and the reference potential.

25. The impedance matching circuit of claim 24 further comprising a second energy storage device connected between the second node and the reference potential.

26. The impedance matching circuit of claim 25 wherein the second energy storage device comprises:
  an inductor including a first end connected to the second node and a second end connected to the reference potential; and
  a capacitor including a first end connected to the reference potential and at a second end connected to the inductor between the first and second ends of the inductor.

27. The impedance matching circuit of claim 25 further comprising a fourth capacitor connected in series with the third variable capacitor and the second inductive element between the third node and the second node.

28. The impedance matching circuit of claim 23 further comprising a first energy storage device connected in parallel with the first variable capacitor between the first node and the third node.

29. The impedance matching circuit of claim 28 further comprising a second energy storage device connected between the second node and the reference potential.

30. The impedance matching circuit of claim 29 further comprising a fourth capacitor connected in series with the third variable capacitor and the second inductive element between the third node and the second node.

31. The impedance matching circuit of claim 23 further comprising a fourth variable capacitor including a first end connected to the third node and a second end connected to a first point of an inductor of the second inductive element,
  wherein the first point is between first and second ends of the inductor.

32. The impedance matching circuit of claim 31 further comprising a fifth variable capacitor including a first end connected to the third node and a second end connected to a second point of the inductor of the second inductive element,
  wherein the second point is between the first and second ends of the inductor, and
  wherein the second point is different than the first point.

33. The impedance matching circuit of claim 22 further comprising a fourth variable capacitor including a first end connected to the second node and a second end connected to a first point of an inductor of the second inductive element,
  wherein the first point is between first and second ends of the inductor.

34. The impedance matching circuit of claim 33 further comprising a fifth variable capacitor including a first end connected to the second node and a second end connected to a second point of the inductor of the second inductive element,
  wherein the second point is between the first and second ends of the inductor, and
  wherein the second point is different than the first point.

35. The impedance matching circuit of claim 34 further comprising an energy storage device comprising:
  an inductor including a first end connected to the second node and a second end connected to the reference potential; and
  a capacitor including a first end connected to the reference potential and a second end connected to a point of the inductor between the first and second ends of the inductor.

36. The impedance matching circuit of claim 23 wherein the first, second, and third variable capacitors include switch capacitors.

37. An impedance matching circuit for a wireless communication device, comprising:
  a first node receiving a first impedance;
  a second node connected to an antenna having a second impedance;
  a first variable capacitor connected between the first node and a third node;
  a second variable capacitor connected between the third node and a reference potential;
  a first inductive element connected in parallel with the second variable capacitor between the third node and the reference potential;
  a third variable capacitor and a second inductive element connected in series between the third node and the second node;
  a first energy storage device connected between the first node and the reference potential; and
  a second energy storage device connected between the second node and the reference potential,
  wherein the second energy storage device comprises:
    an inductor including a first end connected to the second node and a second end connected to the reference potential; and
    a capacitor including a first end connected to the reference potential and at a second end connected to the inductor between the first and second ends of the inductor.

38. An impedance matching circuit for a wireless communication device, comprising:
  a first node receiving a first impedance;
  a second node connected to an antenna having a second impedance;
  a first variable capacitor connected between the first node and a third node;
  a second variable capacitor connected between the third node and a reference potential;
  a first inductive element connected in parallel with the second variable capacitor between the third node and the reference potential;

a third variable capacitor and a second inductive element connected in series between the third node and the second node; and a fourth variable capacitor including a first end connected to the third node and a second end connected to a first point of an inductor of the second inductive element, wherein the first point is between first and second ends of the inductor.

39. The impedance matching circuit of claim 38 further comprising a fifth variable capacitor including a first end connected to the third node and a second end connected to a second point of the inductor of the second inductive element, wherein the second point is between the first and second ends of the inductor, and wherein the second point is different than the first point.

40. An impedance matching circuit for a wireless communication device, comprising:

a first node receiving a first impedance;

a second node connected to an antenna having a second impedance;

a first variable capacitor connected between the first node and a third node;

a second variable capacitor connected between the third node and a reference potential;

a first inductive element connected in parallel with the second variable capacitor between the third node and the reference potential;

a third variable capacitor and a second inductive element connected in series between the third node and the second node; and a fourth variable capacitor including a first end connected to the second node and a second end connected to a first point of an inductor of the second inductive element, wherein the first point is between first and second ends of the inductor.

41. The impedance matching circuit of claim 40 further comprising a fifth variable capacitor including a first end connected to the second node and a second end connected to a second point of the inductor of the second inductive element, wherein the second point is between the first and second ends of the inductor, and wherein the second point is different than the first point.

42. The impedance matching circuit of claim 41 further comprising an energy storage device comprising:

a second inductor including a first end connected to the second node and a second end connected to the reference potential; and a capacitor including a first end connected to the reference potential and a second end connected to a point of the inductor between the first and second ends of the inductor.

* * * * *